United States Patent [19]

Fulton

[11] 4,051,393
[45] Sept. 27, 1977

[54] CURRENT SWITCHED JOSEPHSON JUNCTION MEMORY AND LOGIC CIRCUITS

[75] Inventor: Theodore Alan Fulton, Warren Township, Somerset, N.J.

[73] Assignee: Bell Telephone Laboratories, Incorporated, Murray Hill, N.J.

[21] Appl. No.: 751,127

[22] Filed: Dec. 16, 1976

[51] Int. Cl.$^2$ .......................................... H03K 19/95
[52] U.S. Cl. .................................. 307/306; 307/212; 307/277
[58] Field of Search ................... 307/212, 306, 277; 357/5

[56] References Cited

U.S. PATENT DOCUMENTS

| | | | |
|---|---|---|---|
| 3,281,609 | 10/1966 | Rowell | 307/306 |
| 3,363,200 | 1/1968 | Jaklevic et al. | 332/51 |
| 3,758,795 | 9/1973 | Anacker et al. | 307/306 |
| 3,825,906 | 7/1974 | Hamel | 307/306 X |
| 3,949,395 | 4/1976 | Klein | 307/306 X |
| 3,953,749 | 4/1976 | Baechtold et al. | 307/212 X |

OTHER PUBLICATIONS

*Cryogenics* Feb., 1976, pp. 81–88, "An Inductively Coupled Memory Cell for NDRO with Two Josephson Junctions", by W. Jutzi.

*Primary Examiner*—John S. Heyman
*Attorney, Agent, or Firm*—Michael J. Urbano

[57] ABSTRACT

A superconductive circuit includes a loop circuit having first and second parallel branches connected in parallel with an appropriately terminated fan-out line. Each branch includes a Josephson junction device and the loop circuit includes at least one resistor. A bias current is applied directly to the loop circuit so that each Josephson device is biased below its critical current $I_J$. A control current is then coupled (directly or inductively) to the loop circuit so that in one branch the bias and control currents add and exceed $I_J$. The Josephson device in that branch switches from V = 0 to V = 2Δ causing substantially the entire bias current to flow through the other branch and thereby switching the other Josephson device to V = 2Δ. Now substantially all the bias current is diverted to the fan-out line which can be used to control other similar circuits, i.e., to provide either the control or bias current for other circuits. Logic is performed by using multiple control currents coupled to the loop circuit, a resistor in the fan-out line and preferably resistors in each branch. Memory is achieved by forming a totally superconductive closed circuit path including the fan-out line and a portion of the loop circuit.

17 Claims, 7 Drawing Figures

CURRENT SWITCHED JOSEPHSON JUNCTION MEMORY AND LOGIC CIRCUITS

BACKGROUND OF THE INVENTION

This invention relates to memory and logic circuits and, more particularly, to such circuits employing current-switched Josephson junction devices.

In a paper entitled "Possible New Effects in Superconductive Tunneling," Physics Letters, Vol. 1, p. 251 (1962), B. D. Josephson predicted theoretically that at zero voltage a supercurrent would flow between two superconductors separated by a thin insulating barrier by a mechanism known as two-particle or pair tunneling. Above a critical supercurrent $I_J$ (also referred to as a threshold or zero voltage current) current flows by single particle tunneling at a voltage $V = 2\Delta$, where $2\Delta$ is the superconductor gap voltage. This Josephson effect is exhibited by several device structures which entail two-particle tunneling: SIS devices (U.S. Pat. No. 3,281,609 granted to J. M. Rowell) and SNS devices (U.S. Pat. No. 3,573,661 granted to D. E. McCumber); as well as other devices which do not: a superconducting bridge (Phys. Rev. Let., Vol. 13, p. 195 (1964) by P. W. Anderson et al.) and a point contact structure (U.S. Pat. No. 3,423,607 granted to J. E. Kunzler et al.).

These devices have been proposed for a variety of applications ranging from magnetometers to memory and logic devices. In the latter case, the two basic modes of logic operation, magnetic field switched (MFS) and current-switched (CS), are described in the above-identified Rowell patent. In an MFS device a bias current is set below $I_J$ and a magnetic field is applied to depress $I_J$ below the bias and thereby switch the device from $V = 0$ to $V = 2\Delta$. In contrast, in a CS device $I_J$ is fixed and a control current is added which exceeds $I_J$ and the device again switches from $V = 0$ to $V = 2\Delta$. For example, as described at column 2, lines 59 et seq. of Rowell, a pair of control currents can be applied such that only the sum exceeds $I_J$, thereby performing the AND logic function. In either control current exceeded $I_J$, however, the OR logic function would be performed.

These basic concepts were extended by W. Anacker et al. (U.S. Pat. No. 3,758,795) to a Josephson MFS logic circuit capable of developing a precisely controlled signal from a Josephson tunneling junction which is used to control (switch) the voltage state of succeeding Josephson junctions. As described at column 2, lines 45 et seq., the circuit comprises a Josephson device connected in parallel with a superconductive transmission line terminated in an impedance designed to prevent reflections. Control means are provided for determining the voltage state of the device; to wit, a bias current source which biases the device below $I_J$ and a plurality of current carrying conductors, the current through which creates a magnetic field which intercepts the Josephson device and alters (depresses) $I_J$. A second Josephson device is located in proximity to the transmission line. When the first device is switched, the resulting current pulse in the line produces a magnetic field which is coupled to the second device thereby depressing its critical current. The second device then switches. Thus, the change in state of the first device changes the state of the second device and fan-out is provided. Although Anacker et al. allude to the fact that their circuit could be current-switched (column 2, lines 65 et seq.), they caution that this is not an advantageous way of changing the state of a Josephson device.

It is, however, a broad object of my invention to perform memory and logic operations with current-switched Josephson junction devices.

One problem with MFS logic circuits of the Anacker et al. type (one device controlling the state of one or more others) is that relatively large junction sizes (in excess of 2-3 $\lambda_J$ square, where $\lambda_J$ is typically 40 $\mu$m) are required in order to get appreciable changes in $I_J$. Thus, if a superconductive conductor overlays a junction which is only, say, 0.5 $\lambda_J$ square, then 1 mA of control current through the conductor may depress $I_J$ by only 100 $\mu$A. This situation would mean that the Josephson devices might have to be biased impractically close $I_J$ for currently available design margins. Alternatively, the control current would have to be increased to say, 5-20 mA, thus wasting additional power.

It is another object of my invention to perform CS operations in Josehson circuits having practical design margins so that the Josephson devices need not be biased inordinately close to $I_J$, and can operate at current levels well below 1 mA. These lower currents conserve power and make it easier to fabricate matched transmission lines at smaller dimensions.

Another problem with MFS Josephson circuits, especially those operating at currents in the milliampere range, is that the magnetic field used to depress $I_J$ creates well-known resonances in the I-V characteristic.

It is, therefore, yet another object of my invention to provide a CS Josephson logic circuit which operates free of any deleterious resonance effects.

SUMMARY OF THE INVENTION

A superconductive circuit includes a loop circuit having first and second parallel branches connected in parallel with an appropriately terminated fan-out line. The loop circuit includes a resistor and each branch includes a josephson junction device. Bias current is applied to the loop circuit so that each Josephson device is biased below $I_J$. Control current is coupled (directly or inductively) to the loop circuit so that in one branch the bias and control currents add and exceed $I_J$. The Josephson device in that branch switches from $V = 0$ to $V = 2\Delta$ causing substantially the entire bias current to flow through the other branch and thereby switch the other Josephson device to $V = 2\Delta$. Now substantially all of the bias current is diverted to the fan-out line which can be used to control other similar circuits or to perform memory operations.

For historical reasons related to the shape of the superconductive metallization, the above circuit had been called the "goalpost" (GP).

In one embodiment the current in the GP fan-out line is used as a control current to switch a succeeding GP circuit, whereas in another embodiment that current is used to supply the bias current to a succeeding GP circuit.

In an illustrative embodiment adapted to perform memory operations, the fan-out line and a portion of the loop circuit form a totally superconductive closed circuit path in which a persistent supercurrent flows after the Josephson devices are switched. The presence of this current in the fan-out line (i.e., logic 1) can be sensed by a suitable detector, preferably another goalpost circuit. The totally superconductive circuit is formed by judicious placement of the resistor in the loop circuit; for example, a resistor in only one branch is suitable.

In a specific exemplary embodiment of the GP adapted to perform logic operations, a plurality of synchronized control current pulses are coupled to the loop circuit, the fan-out line includes a resistor and preferably each branch of the loop circuit includes a resistor in series with the Josephson device. Depending on how the bias current level is set in relation to $I_J$ and the control currents, any one of OR, AND, INVERT, EXCLUSIVE OR and CARRY logic functions can be implemented. Preferably the bias current would also be applied in the form of a pulse, but one of longer duration which temporally overlaps the current pulses.

In another illustrative embodiment of the GP, at least one additional branch, having a Josephson device and a resistor in series, is connected in parallel with the loop circuit so that the bias currents from all the parallel Josephson devices are diverted into the fan-out line, thereby giving a larger current for controlling succeeding circuits than is available from the basic loop circuit.

In each of the foregoing embodiments, after being switched to $V = 2\Delta$, the Josephson devices have to be reset to $V = 0$ by some means. Typically this is accomplished by reducing the bias current to the device below the switchback current defined in aforementioned McCumber patent. Applying a negative bias current also accomplishes switchback.

One advantage of the GP is that it can be fabricated of relatively small junctions, typically 0.5 $\lambda_J$ square, so that operation can be effected at low current levels (e.g., 10-100 $\mu A$). Power is thereby conserved and matching to transmission lines (fan-out lines) is more readily achieved. In addition, the absence of magnetic fields used to depress $I_J$ and control switching also means an absence of deleterious resonance effects in the I-V characteristic of the devices.

It is a feature of the GP logic circuits that the loop circuit, as well as the fan-out line, includes resistors (typically nonsuperconductive material which interrupts the superconductive conductors) which eliminate the d.c. response of the circuit, i.e., in the $V = 0$ state they prevent persistent supercurrents from being established in the loop circuit or fan-out line.

In a preferred GP logic or memory circuit embodiment in which control current is inductively coupled to the loop circuit, it is a feature that the mutual inductance between the loop circuit and the control current circuit is comparable to the self inductance of the loop circuit. This allows appreciable control current to be coupled into the loop circuit so that the bias current need not be too near $I_J$ for decent design margins. A concomitant feature, which has the same effect on circuit margins, is that the product of the self inductance of the loop circuit and $I_J$ is substantially greater (i.e., at least 4–5 times greater) than $\Phi_O/2\pi$, where $\Phi_O$ is the well-known flux quantum. This embodiment also has the feature that inductively coupling the control current provides d.c. isolation between the control and bias circuits.

BRIEF DESCRIPTION OF THE DRAWING

These and other objects of my invention, together with its various features and advantages, can be readily understood from the following more detailed description taken in conjunction with the accompanying drawing, in which.

DETAILED DESCRIPTION

Figure 1:
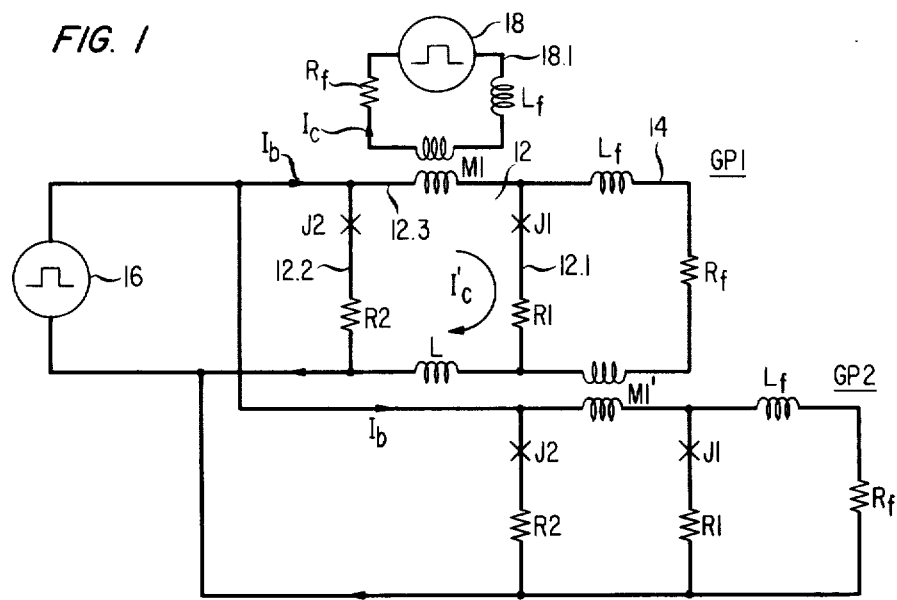
FIG. 1 is a schematic of a GP in which the current in the fan-out line is used to provide inductively coupled control current to a succeeding GP in accordance with one embodiment of my invention.

Before discussing my invention in detail, several matters should be understood. First of all, each of the circuits to be described is in practice maintained within a cryogenically cooled environment well-known in the art in order to reduce the temperature below the superconducting transition temperature of the superconductors used to form the circuits. Secondly, each of the circuits is in practice fabricated on, but insulated from, a superconducting ground plane. The thickness of the insulator between the ground plane and the circuit elements can be used, in conjunction with the thickness and length of the elements, to control the inductance of the circuit. Third, in the drawing discrete inductors are depicted for the purpose of explanation only. These inductors actually represent the distributed self inductance or mutual inductance of the superconductive conductors or strip lines. All such conductors have some inductance, but inductors are shown only where helpful to the discussion. No discrete inductors are actually utilized. Fourth, the drawing also depicts discrete resistors which are formed by inserting segments of normal metals of non-superconductors in the otherwise superconducting circuit paths.

With reference now to FIG. 1, there are shown a pair of goalpost (GP) superconductive circuits GP1 and GP2 coupled to one another. Each GP comprises a loop circuit 12 including first and second branches 12.1 and 12.2 in parallel with one another and in parallel with a fan-out line 14. Each of the branches comprises a Josephson tunnel junction (J1, J2) device in series with a resistor (R1, R2). The inductance of the loop circuit 12 is designated by inductor L, whereas the inductance of the fan-out line 14 is designated by inductor $L_f$. Fan-out line 14 is terminated in a suitable impedance depicted illustratively as resistor $R_f$. The GP circuit also includes means, such as pulsed current source 16, for applying bias current $I_b$ which divides between branches 12.1 and 12.2 so that each of the Josephson devices J1 and J2 is biased beloww its respective critical current $I_{J1}$ and $I_{J2}$. In addition, the GP1 circuit includes means, such as pulsed current source 18 and mutual inductance M1, for generating a pulsed control current $I_c$ in loop 12. In this embodiment the control current $I_c$ flows from source 18 through a superconductive conductor 18.1 which is positioned proximate to a portion of loop 12 such as conductor 12.3. Thereby, a portion $I_c'$ of the control current is coupled into the loop circuit 12 through the mutual inductance M1 between conductors 12.3 and 18.1. Importantly, M1/L is some appreciable fraction of unity (e.g., typically between 0.4 and 0.8) so that a large portion of the control current is coupled into the loop circuit 12.

In the GP circuits the series resistors R1 and R2 in the two branches of the loop circuit determine the relative proportions of the bias current $I_b$ which flows through Josephson devices J1 and J2. In addition, the self-inductance $L_f$ of the fan-out loop 14 is much greater than the self-inductance L of the loop circuit 12, and the terminal resistance $R_f$ is such that $R_f >> R_1 + R_2$. In one mode of operation $R_f$ was chosen so that $R_f I_b \simeq 2\Delta$, the gap voltage in the tunnel junction I-V curve. Greater or smaller values of $R_f I_b$ are also suitable, however. It is assumed that the inductance of J1 and J2 is negligible in comparison to L so that the loop circuit 12 exhibits classical behavior with negligible flux quantization effects. This statement is equivalent to requiring that L $I_J/\Phi_o$ is substantially greater than $\frac{1}{2}\pi$, where $I_J$ is the smaller of the critical currents of J1 and J2 and $\Phi_o = 2.07 \times 10^{-15}$ Wb is the flux quantum.

In operation, assume that initially both of the Josephson devices J1 and J2 are in their zero voltage states. Under these circumstances the control current pulse $I_c$ is coupled through mutual inductance M1 into the loop circuit 12. If the induced control current $I_c'$ flows clockwise in loop circuit 12, it will subtract from the bias current in branch 12.2 leaving Josephson device J2 biased below threshold, but will add to the bias current in branch 12.1 so as to exceed the threshold of Josephson device J1, thereby causing J1 to switch from V = 0 to V = 2Δ. Since the latter voltage state is a high impedance state, substantially all of the bias current will now flow through branch 12.2 and cause Josephson device J2 to also switch to the V = 2Δ state. Now, substantially all of the bias current $I_b$ is diverted to the fan-out line 14 and can be coupled through mutual inductance M2 to serve as the control current of a succeeding goalpost circuit GP2. As shown in FIG. 1, the bias current for GP2 can be derived from a parallel connection with bias current source 16, although a series connection with source 16 would also be suitable. In either event, after the current from fan-out line 14 of GP1 is coupled through M2 to the loop circuit of GP2, the sequence of switching events and the operation of the GP2 circuit is identical to that described with respect to GP1.

Note that GP1 supplies the control current for GP2. Therefore, control current source 18 could itself be a GP supplying control current to GP1, hence the designation of the fan-out line resistance $R_f$ and inductance $L_f$ in series with source 18.

Further insight into the operation of the GP can be gained by assuming that it is fabricated from 25 μm wide strip lines and has the following typical device parameters: $I_J = 0.8$ mA, $I_b = 1.2$ mA, R1 = R2 = 0.125Ω, R = 2Ω, L = 25 pH, M = 20 pH, $L_f$ = 200 pH and 2Δ = 2.4 mV. Once the critical currents are exceeded, J1 and J2 are treated as 20 pF capacitors while the voltages increase between 0 and 2Δ, and once the voltages reach 2Δ they are clamped at that value until the currents change sign. Calculations of voltages and currents were then made using lumped elements which implies that $R_f$ is chosen to be small compared to the characteristic impedance of the lines forming the fan-out line 14. The delay between the control currents and the fan-out line currents, ~ 100 pS, is determined by a combination of the nominal capacitance charging time, $C(2\Delta/0.5I_b) = 80$ ps, the nominal time required to divert the bias current into J2, $L/(2\Delta/I_b) = 12$ ps, and the fan-out line diversion time $L_f/R_f = 100$ pS, and depends upon the ratio of the bias current in J1 to $I_{J1}$ (0.75). Note that some LC oscillations occur in the loop circuit 12 during the charging of the capacitances to V = 2Δ. Although J2 does not require bias current to accomplish its diode-like function, improved margins of operation result if J2 is biased because of the increased values of both bias current $I_b$ and hence the induced loop currents $I_c'$.

The chief function of the loop circuit resistors R1 and R2 is to provide a non-infinite loop time constant which serves to prevent spurious circulating persistent current in the V = 0 state. These currents can arise from various sources. Intrinsically there is the possibility that in the return from V = 2Δ to V = 0 the alternating Josephson currents may briefly excite the low-voltage LC resonance of the loop, and thereby trap a circulating current not necessarily small compared to $I_c$. Less fundamentally, the reduction of the bias currents in J1 and J2 to zero, including the $L_f/R_f$ decay of the diversion current and the discharging of the two capacitors (i.e., the capacitances of J1 and J2), would have to occur quite symetrically to avoid trapping of loop currents. Also a definite sequence of resetting the GP to V = 0 such that the control currents are always made zero before the junctions are returned to V = 0 would be necessary. There are, finally, mundane stray magnetic fields both from external fields and from magnetic fields of the bias circuitry. While all these effects can in principle be designed against with some increase in complexity and expense, it is more practical to prevent them by incorporating resistance in the loop.

Since the loop circuit time constant is not infinite, the induced loop current peaks at a value smaller than $(M/L)I_b$. A typical choice is to set $L/(R1 + R2) \sim 2L_f/R_f$ to provide a reasonable compromise between avoiding long decay times and achieving adequate integration of the control signal. For $R_f \sim 2\Delta/I_b$ and an exponential rise to $I_b$ of the control current this gives $\gamma \sim 0.5$ M/L, where $\gamma$ is the ratio of the maximum of the induced current in loop circuit 12 to $I_b$. If $R_f$ is made smaller compared to $2\Delta/I_b$ so that control current rises nearly linearly to $I_b$ in a time $L/(2\Delta/I_b)$, one can obtain $\gamma \geq 0.75$ M/L. For reasonable geometries, M/L ~ 0.8 seems obtainable, so $\gamma \sim 0.4$ to 0.6 is the expected range.

Figure 2:
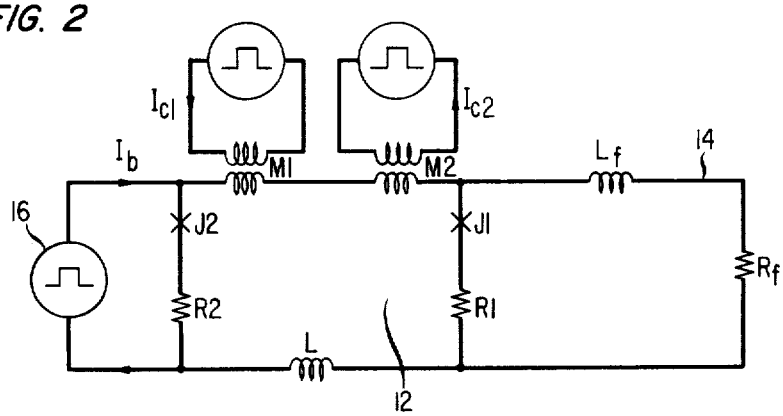
FIG. 2 is a schematic of another embodiment of my invention in which a GP is provided with a plurality of inductively coupled control currents to perform logic.

As an illustration of the margins provided by this operation, consider the AND logic function performed by the GP circuit of FIG. 2. A pair (a plurality in general) of control currents $I_{c1}$ and $I_{c2}$ are inductively coupled through M1 and M2, respectively, to loop circuit 14. The levels of $I_{c1}$ and $I_{c2}$ in relation to $I_b$ and $I_J$ are such that only when both $I_{c1}$ and $I_{c2}$ are simultaneously applied is $I_J$ exceeded in either J1 or J2. If $\alpha_1$ is denoted as the fraction of $I_b$ used to bias J1, then the inequalities $(\gamma + \alpha_1) I_b < I_{J1} < (2\gamma + \alpha_1 I)I_b$ and $(1 - \alpha_1)I_b < I_{J2} < I_b$ give the limits of permissible variation of $I_{J1}$ and $I_{J2}$ which would still give correct AND operation. This assumes negligible current overshoot in J2 from the capacitance of J1. If the optimum $a_1$ is taken to be that giving equal values to the ratios $m_1 = (2\gamma + a_1)/(\gamma + a_1)$ and $m_2 = 1/(1 - a_1)$, then $a_1(\text{optimum}) = \sqrt{\gamma^2+\gamma}-\gamma$. The margins $m_1$ and $m_2$ then climb steeply for small $\gamma$ and more slowly for larger $\gamma$. For example, for $\gamma = 0.4$, 0.6 and 1.0 one obtains $m_1 = m_2 = 1.53$, 1.61, and 1.71, respectively. Somewhat larger margins occur for OR and INVERT operations for the same $\gamma$. Such margins are comparable to or somewhat smaller than those predicted for various varieties of MFS junctions. (Better margins can be achieved, however, by employing modified GPs such as that to be discussed with reference to FIG. 3.) In addition to these margins, the finite loop decay time requires that the control signals for AND and INVERT occur within $\sim L_f/R_f$ of each other. However, some degree of time control on this level is required in any latching logic circuitry to cope with INVERSION operations.

Of course, other logic functions can be performed in the GP circuit of FIG. 2 by setting the current levels (1) such that either $I_{c1}$ or $I_{c2}$ will switch the GP (OR); (2) such that either will switch but the polarities of $I_{c1}$ and $I_{c2}$ are opposite so that they cause mutual cancellation and do not switch the GP (exclusive OR); (3) such that $I_{c1}$ and $I_{c2}$ have opposite polarities, $I_{c2}$ is always present but trailing $I_{c1}$ in time. If $I_{c1}$ is made unable to switch the GP and $I_{c2}$ is able, but $I_{c2} - I_{c1}$ is not able, then the circuit functions as an INVERT for $I_{c1}$; and (4) with $m$ control sources coupled to the loop circuit, the GP can function to operate when any $n$ out of $m$ ($n \leq m$) control pulses are present (2 out of 3 — CARRY; 3 out of 3 — AND; 1 out of 3 — OR).

In contrast with prior art MFS logic devices (e.g., single junctions of length $>2$–$3$ $\lambda_J$ or two or three junction interferometers), the current switched (CS) goalpost (GP) described above possesses two advantages. First, the CS-GP device does not encounter the magnetic-field-induced geometrical resonance features in the I-V curve which sometimes plague the long junctions. Such features associated with the LC resonance can also occur in the interferometer. The equivalent LC resonance in the GP is at a frequency well below the plasma resonance, because of the large inductance of loop circuit 12, and is therefore unlikely to be excited in the steady state. Second, the large inductance limit of operation and the introduction of resistance in the loop circuit of the GP make it insensitive to trapped magnetic flux quanta in the films of the loop circuit or the ground plane, a problem of potential concern in the interferometer. Also, in common with the interferometer, the GP is more readily matched to the higher-impedance lines encountered in small geometries than is the long junction, i.e., it can more readily operate with smaller $I_c$ and therefore reduced power dissipation. Its chieef disadvantage compared to the prior art devices is in the requirement for synchronism of the input timing signals and the somewhat reduced operating margins caused by the introduction of the inner-loop resistors. (As mentioned previously, modified GPs (FIG. 3) have improved margins.) There is also a disadvantage in the need for controlling the $L_f/R_f$ risetime of the control current to achieve uniformity in the magnitude of the induced currents in loop circuit 12. This could require that the fan-out line inductances be trimmed to compensate for differing lengths, a technique will within the ability of those of ordinary skill in the art.

A simple circuit was constructed from Sn-oxide-Sn tunnel junctions incorporating five GPs. For appropriate biases the circuit performed OR, AND and INVERT operations. Several of these circuits were constructed using metal shadow masks with 100 $\mu$m linewidths. Both overlaid, insulated control lines and directly attached control lines were employed. All logic functions were demonstrated at relatively low speeds, about a few nsec, for high-inductance ($\sim 10^{-9}$ H) fan-out lines (no ground plane). These operations worked as expected regarding isolation of input and output as well as timing and amplitude margins. Maximum values of $\gamma \sim 0.25$ were achieved, reflecting a non-optimized value of M/L $\sim 0.4$. Typical critical currents $\sim 0.5$ mA were employed, leading to logic delays of $\sim 600$ psec for these somewhat high-capacitance ($\sim 300$ pF) junctions. A full adder circuit utilizing GPs with larger $\gamma$ and improved logic and propagation delays was also fabricated. The full adder employed directly coupled control currents.

It is to be understood that the above-described arrangements are merely illustrative of the many possible specific embodiments which can be devised to represent application of the principles of the invention. Numerous and varied other arrangements can be devised in accordance with these principles by those skilled in the art without departing from the spirit and scope of the invention.

Figure 3:
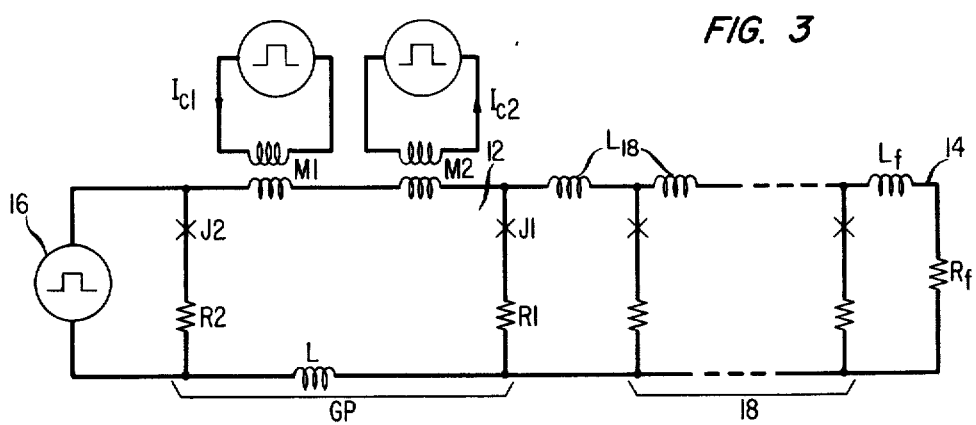
FIG. 3 is a schematic of a GP of the type shown in FIG. 2 but which includes a plurality of branches in parallel with the loop circuit in accordance with yet another embodiment of my invention.

In particular the circuit margins of the GP, for example the logic arrangement of FIG. 2, can be improved as shown in FIG. 3 by adding one or more additional branches 18 in parallel with the loop circuit 12 of the basic GP. Each of the additional branches would also comprise a Josephson junction device in series with a resistor and would switch to the V = 2$\Delta$ state once the loop circuit 12 switches in response to the control currents. To this end, the self-inductance $L_{18}$ between the loop circuit 12 and each added branch should preferably be such that $L_{18} \geq L$. In this fashion the bias currents from all of the parallel branches are diverted into the fan-out line 14 thereby providing a larger fan-out (control) current than is available from the basic loop circuit alone. This in turn means that the Josephson devices can be biased further below $I_J$; i.e., margins are improved.

Figure 4:
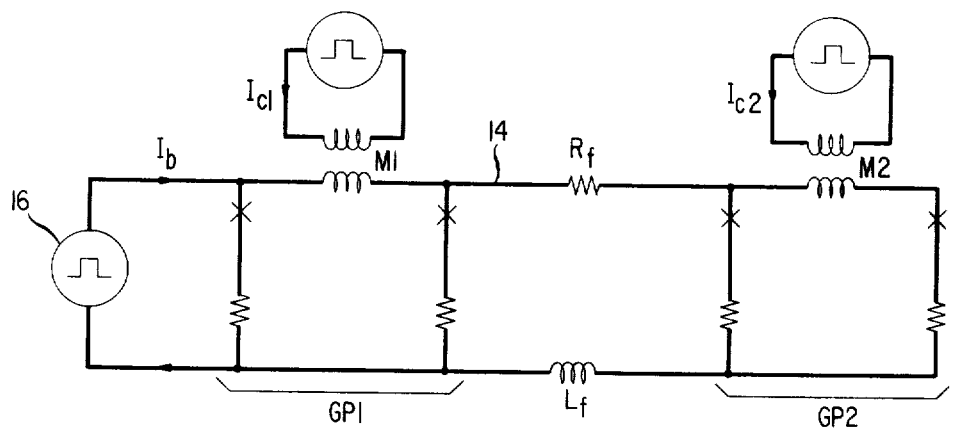
FIG. 4 is a schematic of a GP logic circuit in which the current in the fan-out line is used to provide the bias current for a succeeding GP in accordance with still another embodiment of my invention.

As mentioned previously a GP circuit can be used to provide not only the control current (FIG. 1) but also the bias current (FIG. 4) for another GP circuit. Thus, as shown in FIG. 4, GP1 functions a described with reference to FIG. 1 (or FIGS. 2 or 3 if multiple control currents are used) so that GP1 switches when control current $I_{c1}$ is applied, thereby coupling the bias current $I_b$ through fan-out line 14 to GP2. Then GP2 is ready to be switched at any subsequent time (within the duration of the fan-out pulse) by the application of control current $I_{c2}$. This circuit is useful for storing information in a pulsed circuit since GP2 will switch upon being interrogated by $I_{c2}$ only if GP1 has been previously switched by $I_{c1}$.

Figure 5:
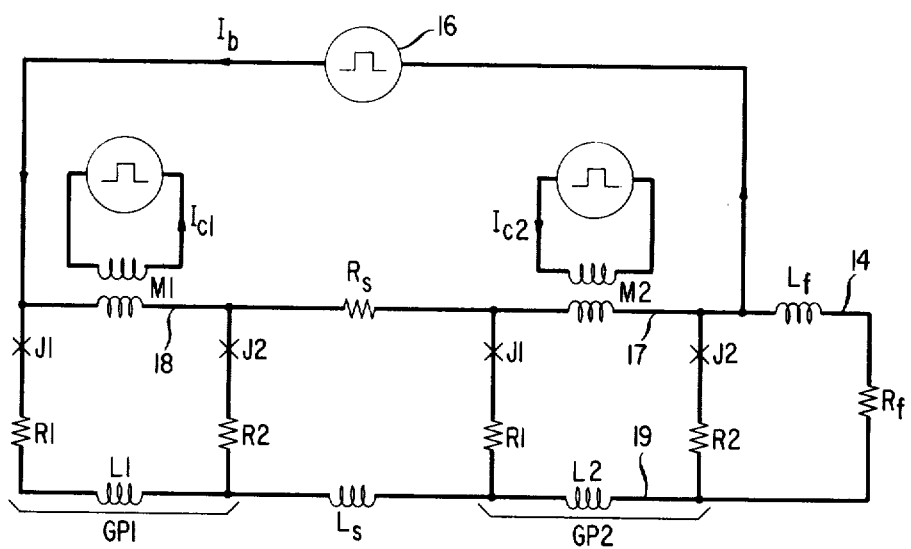
FIG. 5 is a schematic of another embodiment of my invention in which one GP acts as an INHIBIT to prevent bias current from diverting to the fan-out line even if the other GP is switched.

Alternatively, a pair of goalpost circuits GP1 and GP2 can be connected in series with one another by resistor $R_s >> R_1$ or $R_2$ and in series with a bias current source 16 as shown in FIG. 5 (rather than having the bias current source in parallel with the GP's as shown in FIG. 1). Under these circumstances, if neither $I_{c1}$ nor $I_{c2}$ is applied, both GPs are in the V = 0 state and $I_b$ flows through GP1 and GP2, but not in fan-out line 14. If $I_{c1}$ is applied, but not $I_{c2}$, then GP1 switchhes to V = 2$\Delta$ and $I_b$ flows through upper arm 18 of GP1, $R_s$, and upper arm 17 of GP2, but again not in fan-out line 14. If both $I_{c1}$ and $I_{c2}$ are applied, but $I_{c1}$ first, no current flows in fan-out line 14. However, if $I_{c2}$ is applied, but not $I_{c1}$, then $I_b$ flows through GP1, $L_l$, $L_2$ (lower arm 19 of GP2) and into fan-out line 14 (logic 1). Thus, GP1 acts as an INHIBIT in that if $I_{c1}$ is applied, $I_{c2}$ has no effect. Consequently, if $I_{c2}$ is applied, then the output is the inverse of $I_{c1}$.

Figure 6:
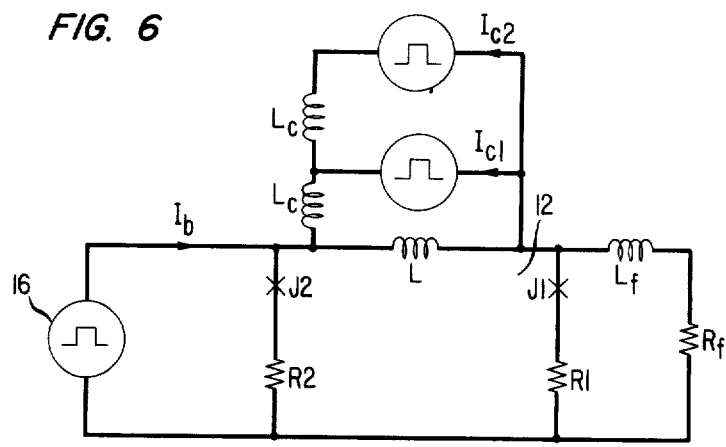
FIG. 6 is a schematic of a GP logic circuit in which control current is directly coupled to the loop circuit in accordance with one more embodiment of my invention.

Finally, the control currents as mentioned previously can be directly coupled to the loop circuit 12 as shown in FIG. 6, as well as being inductively coupled as in FIGS. 1-5. This configuration, however, requires that care be exercised with respect to DC voltages. The induced currents in the loop circuit can be made as large as those resulting from an insulated overlaid control line (i.e., inductively coupled control currents), but multiple control lines are more easily accommodated (higher equivalent M/L ratios than are attainable without stacking control lines on top of one another). Alignment of control lines also is non-critical. This circuit does have isolation between the control and bias circuits; that is, when J1 and J2 switch to $V = 2\Delta$, $I_b$ flows into fan-out line 14 and not into the control circuits because the self-inductance $L_c$ of the control circuits (e.g., equivalently $L_f$ of a fan-out line) is made such that $L_c >> L$. With this circuit as the basic building block, a one-bit full adder was constructed from using 100 $\mu$m basic linewidth and 25 $\mu$m square Sn-oxide-Sn Josephson tunnel junctions. It operated under all input data conditions with an add time of about 1 ns and a power dissipation of 1 $\mu$W per gate (GP). Compared to inductively coupled current switching schemes of FIGS. 1-5, direct coupling provides larger switching margins and eliminates mutual inductances. Fabrication is somewhat simpler because no control lines pass over the Josephson devices or the input circuit. However, direct coupled circuits are biased in parallel and therefore require higher current bias sources. In addition, cross-talk may be a problem but may be reduced by using an appropriately patterned ground plane.

The reliability of either a direct-coupled or inductively coupled GP circuit can be enhanced by using two or more series-connected Josephson junctions in each branch of the loop circuit to protect against short-circuiting of a particular junction. Normally only the Josephson junction with a lower critical current in each branch would switch. If, however, the two critical currents are nearly equal, all four (or more) may switch and divert the bias current into the fan-out line more rapidly.

A number of the foregoing GP circuits have been fabricated by evaporating tin or lead through metal shadow masks and onto glass substrates. First, gold resistors were evaporated and then were overcoated with 25 nm of copper to act as a diffusion barrier. The first superconducting layer was 200 nm of lead covered by 25 nm of copper to assure low resistance contact to following layers. A 150 nm layer of SiO provided insulation at crossovers. Next, 300 nm of tin was evaporated to form the lower electrode of each Josephson junction. Without breaking vacuum the tin was oxidized in a DC glow discharge in oxygen and 300 nm of tin was evaporated to form the top electrode of each Josephson junction. When a ground plane was to be applied, the sample was coated with 1.0 $\mu$m film of Kodak KTFR photoresist. After developing holes for contacts to the lead wires a patterned tin ground plane was applied on top of the KTFR using a photoresist stencil technique.

Figure 7:
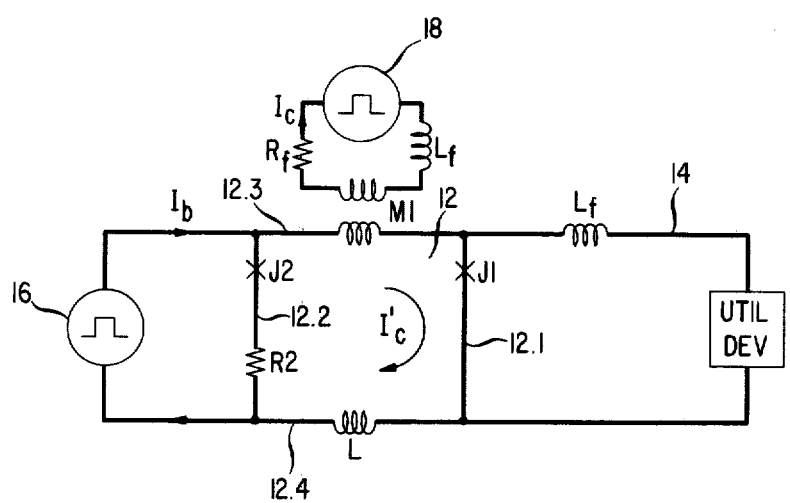
FIG. 7 is a schematic of a GP memory circuit in accordance with yet another embodiment of my invention.

As mentioned previously the GP circuit can be utilized to perform memory operations as well as logic. One such circuit is shown in FIG. 7 where to facilitate comparison the reference numerals of GP1 of FIG. 1 have been used for corresponding (not necessarily identical) components. The memory GP is similar to the logic GP1 of FIG. in that the loop circuit 12 includes a resistor R2 but differs from GP1 of FIG. 1 in that a totally superconductive (memory) path is formed which includes the fan-out line 14 and a portion of the loop circuit 12. In this example the portion is shown to be branch 12.1 which includes no resistor and which is the branch proximate fan-out line 14. In operation the control current from source 18 is coupled through M1 into loop circuit 12 as before and causes J1 and then J2 to switch from $V = 0$ to $V = 2\Delta$. The bias current is then diverted into the fan-out line 14. Now, when $I_b$ is removed a persistent supercurrent flows in the memory path formed by fan-out line 14 and branch 12.1, but the resistor R2 prevents such a current in loop circuit 12. The presence of this current, which might represent logic 1, can be sensed by a suitable detector such as utilization device 15. Such a device should not insert resistance into the memory path and is preferably another GP memory circuit.

It is of course apparent that other variations of FIG. 7 are readily possible. If a resistor is not placed in branch 12.1 (in series with J1), then a resistor can be placed in any or all of the remaining portions 12.2, 12.3, 12.4. Conversely, if a resistor is placed in branch 12.1 (in series with J1), then no resistor can be placed in any of the other portions 12.2, 12.3, 12.4 of loop circuit 12.

What is claimed is:

1. A superconductive circuit comprising:
a loop circuit including a resistor, and first and second branches in parallel with one another,
said first and second branches including first and second Josephson junction devices, respectively;
a fan-out line connected in parallel with said branches,
bias means for applying a pulsed bias current to said loop circuit so that said devices are biased below their critical current $I_J$ for switching said devices from their zero voltage state to their finite voltage state, and
control means for generating a pulsed control current in said loop circuit so that in said first branch the bias and control currents add and exceed $I_J$ causing said first device to switch to its finite voltage state, which then causes substantially the entire bias current to flow through said second branch exceeding $I_J$ and causing said second device to switch to its finite voltage state, which in turn causes substantially the entire bias current to divert to said fan-out line.

2. The circuit of claim 1 wherein the inductance L of said loop circuit and the critical current $I_J$ of said devices are mutually adapted so that L $I_J/\Phi_o$ is substantially greater than $\frac{1}{2}\pi$, where $\Phi_o$ is the flux quantum.

3. The circuit of claim 1 wherein said fan-out line and a portion of said loop circuit form a closed totally superconductive circuit path into which said bias current is diverted after said devices are switched.

4. The circuit of claim 3 wherein one of said branches is proximate said fan-out line, no resistor is placed in said proximate branch and a resistor is placed in a portion of the remainder of said loop circuit.

5. The circuit of claim 3 wherein one of said branches is proximate said fan-out line, a resistor is placed in said proximate branch and no resistor is placed in any portion of the remainder of said loop circuit.

6. The circuit of claim 1 wherein said fan-out line also includes a resistor.

7. The circuit of claim 6 wherein each of said branches includes a resistor in series with each of said Josephson devices.

8. The circuit of claim 6 wherein said control means includes means for coupling a plurality of separate pulsed control currents into said loop circuit, the amplitude and timing of said control current pulses being mutually adapted in relation to $I_J$ and the bias current pulses to that logic operations are performed.

9. The circuit of claim 8 wherein the duration of said bias pulses is longer than that of said control pulses.

10. The circuit of claim 1 wherein said control means includes means for inductively coupling said control current into said loop circuit.

11. The circuit of claim 1 wherein said control means includes means for directly coupling said control current into said loop circuit.

12. The circuit of claim 6 including a second one of said loop circuits directly connected to said fan-out line so that the current in said fan-out line provides said bias means for said second loop circuit, and second control mean for generating a pulsed control current in said second loop circuit.

13. The circuit of claim 6 including a second one of said loop circuits and a second one of said fan-out lines connected in parallel with said second loop circuit, said bias means also applying pulsed bias current to said second loop circuit, and means for coupling the current in said first fan-out line into said second loop circuit.

14. The circuit of claim 13 wherein the current in said fan-out line is inductively coupled to said second loop circuit.

15. The circuit of claim 13 wherein the current in said fan-out line is directly coupled to said second loop circuit.

16. The circuit of claim 6 including a plurality of additional branches connected in parallel with said loop circuit, each of said plurality comprising a Josephson junction device and a resistor in series.

17. The circuit of claim 6 including
a second one of said loop circuits,
a resistor connecting said loop circuits in series,
said bias means being connected in series with said loop circuits and said resistor,
second control means for generating a pulsed control current in said second loop circuit,
bias current being diverted to said fan-out line only when a control pulse is applied to said loop circuit in parallel with said fan-out line and no control pulses is applied to said second loop circuit.

* * * * *